(12) United States Patent
Hara et al.

(10) Patent No.: US 8,125,298 B2
(45) Date of Patent: Feb. 28, 2012

(54) ACOUSTIC WAVE FILTER, DUPLEXER USING THE ACOUSTIC WAVE FILTER, AND COMMUNICATION APPARATUS USING THE DUPLEXER

(75) Inventors: Motoaki Hara, Kawasaki (JP); Tokihiro Nishihara, Kawasaki (JP); Shinji Taniguchi, Kawasaki (JP); Takeshi Sakashita, Kawasaki (JP); Tsuyoshi Yokoyama, Kawasaki (JP); Masafumi Iwaki, Kawasaki (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 88 days.

(21) Appl. No.: 12/684,481

(22) Filed: Jan. 8, 2010

(65) Prior Publication Data
US 2010/0110940 A1    May 6, 2010

Related U.S. Application Data

(63) Continuation of application No. PCT/JP2007/066388, filed on Aug. 23, 2007.

(51) Int. Cl.
    H03H 9/70    (2006.01)
    H03H 9/72    (2006.01)
    H03H 9/54    (2006.01)
    H03H 9/64    (2006.01)
(52) U.S. Cl. .................. 333/133; 333/189; 333/193
(58) Field of Classification Search .............. 333/133, 333/189–196; 310/313 B
    See application file for complete search history.

(56) References Cited

U.S. PATENT DOCUMENTS

| | | | |
|---|---|---|---|
| 4,127,833 A * | 11/1978 | Bezemer et al. | 333/189 |
| 6,556,100 B2 * | 4/2003 | Takamine | 333/133 |
| 6,844,795 B2 | 1/2005 | Inose | |
| 7,170,370 B2 | 1/2007 | Inoue et al. | |
| 7,271,684 B2 * | 9/2007 | Nishihara et al. | 333/133 |
| 7,385,464 B2 * | 6/2008 | Shibagaki et al. | 333/133 |
| 7,854,049 B2 * | 12/2010 | Yoshino et al. | 29/25.35 |
| 2003/0067368 A1 * | 4/2003 | Ohara et al. | 333/188 |
| 2003/0227338 A1 * | 12/2003 | Kawakubo et al. | 331/107 A |
| 2003/0227358 A1 | 12/2003 | Inose | |
| 2004/0227587 A1 | 11/2004 | Inoue et al. | |

(Continued)

FOREIGN PATENT DOCUMENTS

EP    1 478 091 A2    11/2004

(Continued)

*Primary Examiner* — Barbara Summons
(74) *Attorney, Agent, or Firm* — Chen Yoshimura LLP

(57) ABSTRACT

An acoustic wave filter having excellent steepness is provided without adding any exterior components or any new manufacturing steps. A plurality of filters (10-1) each having a first resonator (2a-1) placed in a serial arm and having a resonance frequency $f_{rs}$ and an anti-resonance frequency $f_{as}$, and a second resonator (4a-1) placed in a parallel arm and having a resonance frequency $f_{rp}$ and an anti-resonance frequency $f_{ap}$ are provided on a same substrate, where the resonance frequency $f_{rs}$ of the first resonator is higher than the resonance frequency $f_{rp}$ of the second resonator; the anti-resonance frequency $f_{as}$ of the first resonator is higher than the anti-resonance frequency $f_{ap}$ of the second resonator; and the filters (10-1) are connected in multiple stages. At least one of the filters (10-1) connected in multiple stages has a third resonator (6-1) having a resonance frequency $f_{rp}$ and an anti-resonance frequency $f_{ap}$. The third resonator (6-1) is formed on the substrate and connected to the serial arm in parallel with respect to the first resonator (2a-1).

12 Claims, 11 Drawing Sheets

U.S. PATENT DOCUMENTS

| | | |
|---|---|---|
| 2006/0164183 A1 | 7/2006 | Tikka et al. |
| 2006/0207713 A1* | 9/2006 | Eun et al. ................... 156/153 |
| 2007/0052327 A1* | 3/2007 | Vilander ..................... 310/343 |
| 2007/0052494 A1* | 3/2007 | Shibagaki et al. .......... 333/133 |
| 2007/0090898 A1* | 4/2007 | Kando ......................... 333/195 |

FOREIGN PATENT DOCUMENTS

| | | |
|---|---|---|
| JP | 2000-77972 A | 3/2000 |
| JP | 2001-144585 A | 5/2001 |
| JP | 2003-332884 A | 11/2003 |
| JP | 2004-015397 A | 1/2004 |
| JP | 2004-343168 A | 12/2004 |
| JP | 2006-502634 A | 1/2006 |
| JP | 2006-135921 A | 5/2006 |
| JP | 3827232 B2 | 7/2006 |
| JP | 2007-74459 * | 3/2007 |
| WO | WO 2004/034579 A1 | 4/2004 |

* cited by examiner

ACOUSTIC WAVE FILTER, DUPLEXER USING THE ACOUSTIC WAVE FILTER, AND COMMUNICATION APPARATUS USING THE DUPLEXER

CROSS-REFERENCE TO RELATED APPLICATIONS

The present application is based upon and claims the benefit of priority of the prior PCT/JP2007/066388 filed on Aug. 23, 2007, the entire contents of which are incorporated herein by reference.

FIELD

The present application relates to an acoustic wave filter used in an apparatus to be applied to mobile communications and high-frequency wireless communications; a duplexer using the same, and a communication apparatus using the duplexer.

BACKGROUND

Due to the rapid widespread of wireless apparatuses such as mobile phones, demand for small-sized and light-weighted high-frequency filters has been increased, and an acoustic wave filter formed on a single substrate has been accepted widely in the market. This type of acoustic wave filter is formed by using FBAR (Film Acoustic Bulk Resonator), SMR (Solidly Mounted Resonator), a SAW (Surface Acoustic Wave) resonator or the like.

For example, when using signals of different passbands (frequency bands that pass the signals) just like a case of a duplexer, interference is prevented by providing an unused frequency band (guard band) between the frequency band and an adjacent frequency band. However it is required to narrow the guard band for the purpose of effective utilization of the frequency bands. For narrowing the guard band, the high-frequency filter is required to have a steep cut-off characteristic, but the cut-off characteristic is limited by the Q-value of the resonator that configures the filter.

In an acoustic wave filter proposed to provide steepness not less than the limit of Q value of the resonator, an extremum is formed at a frequency lower than the anti-resonance frequency $f_{as}$ of the first resonator, or an extremum is formed at a frequency higher than the resonance frequency $f_{rp}$ of the second resonator, by use of capacitance (see Patent Document 2004-343168 for example).

However, the above-described conventional acoustic wave filters require capacitors, and use of such capacitors as external chip components hinders production of small-sized acoustic wave filters. Although it is also possible to provide a configuration where a capacitor is integrated on the same substrate on which the acoustic wave filter is provided, it requires addition of a step of manufacturing the capacitor to the process of manufacturing the acoustic wave filter, resulting in cost increase.

SUMMARY

A first acoustic wave filter of the present application includes: a first resonator that is placed in a serial arm and that has a resonance frequency $f_{rs}$ and an anti-resonance frequency $f_{as}$; and a second resonator that is placed in a parallel arm and that has a resonance frequency $f_{rp}$ and an anti-resonance frequency $f_{ap}$, the first resonator and the second resonator are formed on a same substrate; the resonance frequency $f_{rs}$ of the first resonator is higher than the resonance frequency $f_{rp}$ of the second resonator; and the anti-resonance frequency $f_{as}$ of the first resonator is higher than the anti-resonance frequency $f_{ap}$ of the second resonator. For solving the above-mentioned problems, the acoustic wave filter is characterized in that it has a third resonator that is connected to the serial arm in parallel with respect to the first resonator and that has a resonance frequency $f_{rp}$ and an anti-resonance frequency $f_{ap}$, and that the third resonator is formed on the substrate.

The second acoustic wave filter of the present application includes: a first resonator that is placed in a serial arm and that has a resonance frequency $f_{rs}$ and an anti-resonance frequency $f_{as}$; and a second resonator that is placed in a parallel arm and that has a resonance frequency $f_{rp}$ and an anti-resonance frequency $f_{ap}$, the first resonator and the second resonator are formed on a same substrate; the resonance frequency $f_{rs}$ of the first resonator is higher than the resonance frequency $f_{rp}$ of the second resonator; and the anti-resonance frequency $f_{as}$ of the first resonator is higher than the anti-resonance frequency $f_{ap}$ of the second resonator. For solving the above-mentioned problems, the acoustic wave filter is characterized in that it has a fourth resonator that is connected to the parallel arm in series with respect to the second resonator and that has a resonance frequency $f_{rs}$ and an anti-resonance frequency $f_{as}$, and that the fourth resonator is formed on the substrate.

A third acoustic wave filter of the present application includes: a plurality of filters on a same substrate, each of the filters having a first resonator that is placed in a serial arm and that has a resonance frequency $f_{rs}$ and an anti-resonance frequency $f_{as}$, and a second resonator that is placed in a parallel arm and that has a resonance frequency $f_{rp}$ and an anti-resonance frequency $f_{ap}$, the resonance frequency $f_{rs}$ of the first resonator is higher than the resonance frequency $f_{rp}$ of the second resonator; the anti-resonance frequency $f_{as}$ of the first resonator is higher than the anti-resonance frequency $f_{ap}$ of the second resonator; and the filters are connected in multiple stages. For solving the above-mentioned problems, the acoustic wave filter is characterized in that at least one of the filters connected in multiple stages has a third resonator whose resonance frequency is $f_{rp}$ and whose anti-resonance frequency is $f_{ap}$, the third resonator is formed on the substrate and connected to the serial arm in parallel with respect to the first resonator.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

DESCRIPTION OF THE EMBODIMENTS

Figure 1:
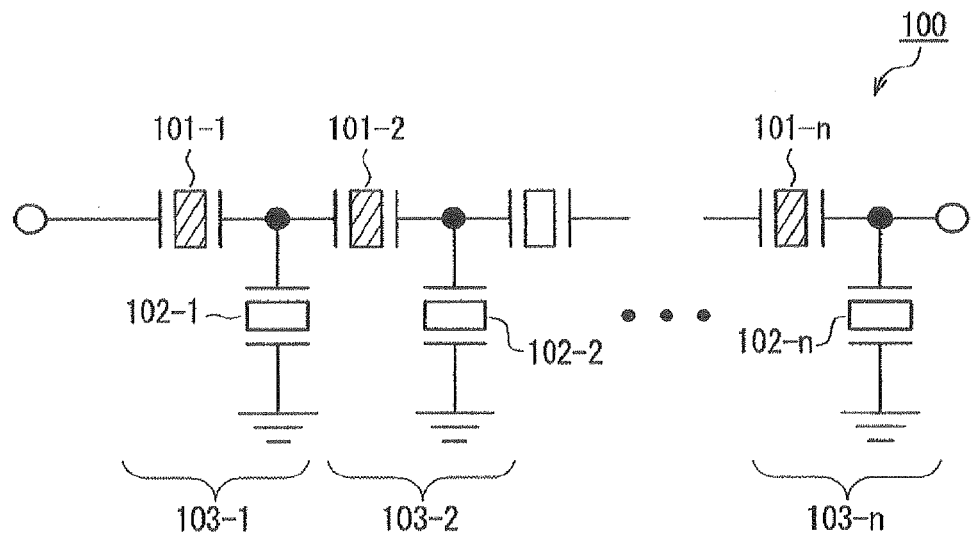
FIG. 1 is a circuit diagram illustrating a configuration of a conventional ladder-type acoustic wave filter.
Figure 2:
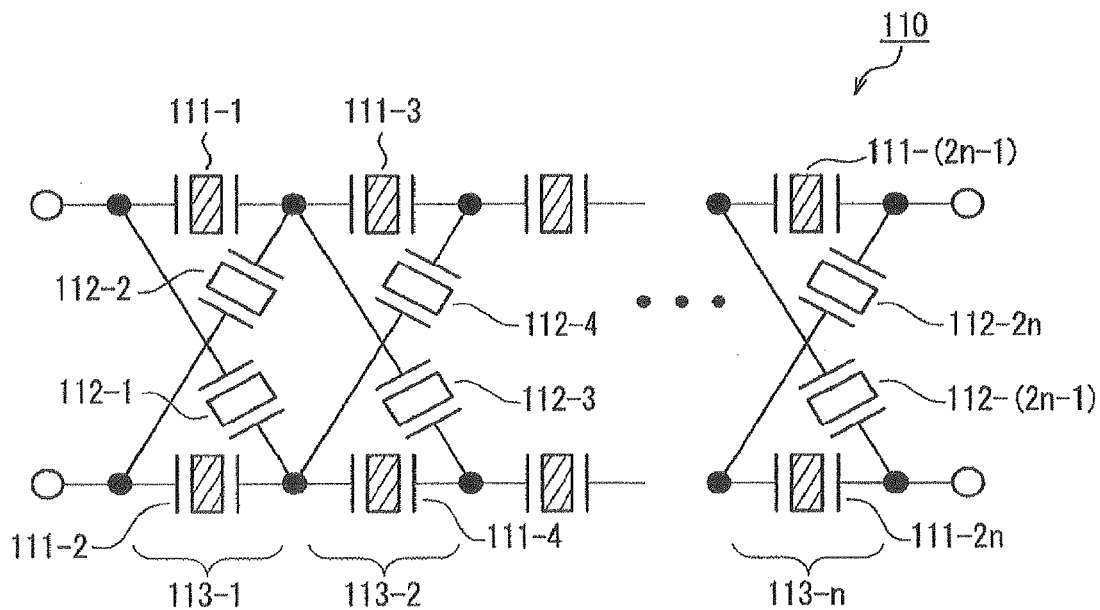
FIG. 2 is a circuit diagram illustrating a configuration of a conventional lattice-type acoustic wave filter.

FIG. 1 is a circuit diagram illustrating a configuration of a typical ladder-type acoustic wave filter 100, and FIG. 2 is a circuit diagram illustrating a configuration of a lattice-type filter 110. In the acoustic wave resonator 100 as illustrated in FIG. 1, n number of filters 103-1 . . . 103-$n$ are cascaded in multiple stages. The filter 103-1 is configured with a first resonator 101-1 placed in a serial arm and a second resonator 102-1 placed in a grounded parallel arm. The first resonator 101-1 has a resonance frequency $f_{rs}$ and an anti-resonance frequency $f_{as}$. The second resonator 102-1 has a resonance frequency $f_{rp}$ and an anti-resonance frequency $f_{ap}$. Just like the filter 103-1, the filters 103-2 . . . 103-$n$ are configured respectively with first resonators 101-2 . . . 101-$n$ placed in the serial arm and second resonators 102-2 . . . 102-$n$ placed in parallel arms.

In FIG. 1, the first resonators 101-1 . . . 101-$n$ are hatched for distinguishing easily the first resonators 101-1 . . . 101-$n$ from the second resonators 102-1 . . . 102-$n$, but not for expressing that different types of resonators (for example, FBAR and SAW) are used (this is applicable also to the remaining drawings).

In the lattice-type acoustic wave filter 110 illustrated in FIG. 2, n number of filters 113-1 . . . 113-$n$ are cascaded in multiple stages. The filter 113-1 is configured with first resonators 111-1, 111-2 placed respectively in two serial arms, and second resonators 112-1, 112-2 placed respectively in two parallel arms formed to cross each other. The first resonators 111-1, 111-2 have a resonance frequency $f_{rs}$ and an anti-resonance frequency $f_{as}$. The second resonators 112-1, 112-2 have a resonance frequency $f_{rp}$ and an anti-resonance frequency $f_{ap}$. Just like the filter 113-1, the filters 113-2 . . . 113-$n$ are configured respectively with first resonators 111-3 . . . 111-2$n$ placed in each of the two serial arms and the second resonators 112-3 . . . 112-2$n$ placed in each of the two parallel arms.

For example, when using signals of different passbands (frequency bands that pass the signals) just like a case of a duplexer, interference is prevented by providing an unused frequency band (guard band) between the frequency band and an adjacent frequency band. However, it is required to narrow the guard band for the purpose of effective utilization of the frequency bands. For narrowing the guard band, the high-frequency filter is required to have a steep cut-off characteristic, but the cut-off characteristic is limited by the Q-value of the resonator that configures the filter.

In an acoustic wave filter proposed to provide steepness not less than the limit of Q value of the resonator, an extremum is formed at a frequency lower than the anti-resonance frequency $f_{as}$ of the first resonator, or an extremum is formed at a frequency higher than the resonance frequency $f_{rp}$ of the second resonator, by use of capacitance (see Patent Document 2004-343168 for example).

Figure 3:
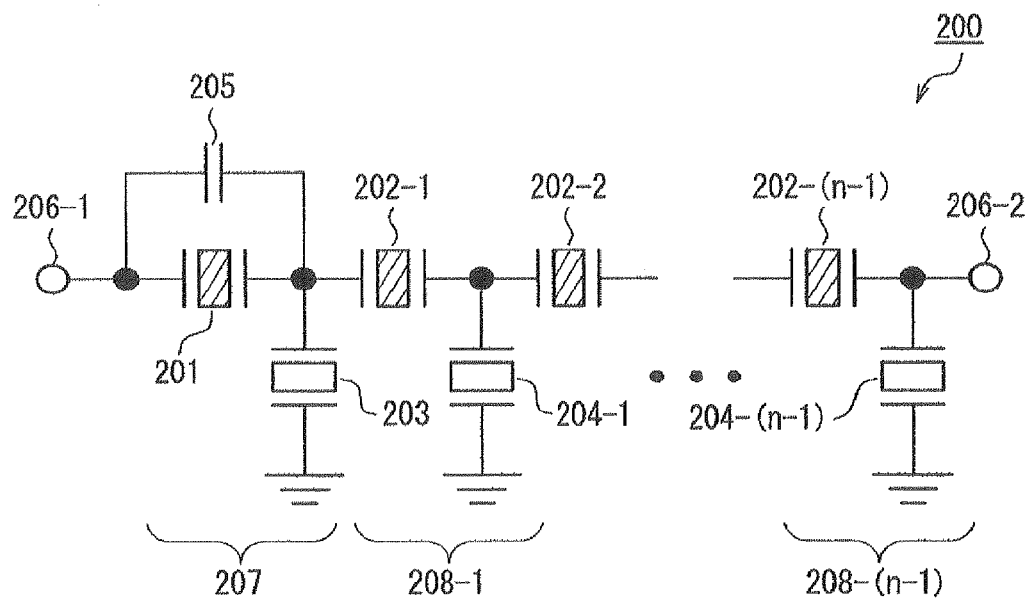
FIG. 3 is a circuit diagram illustrating a configuration of another conventional ladder-type acoustic wave filter.

Hereinafter, a conventional acoustic wave filter having an extremum at a frequency lower than the anti-resonance frequency $f_{as}$ of a first resonator is described. FIG. 3 is a circuit diagram illustrating a configuration of an acoustic wave filter 200. In the acoustic wave filter 200, a first filter 207 and n−1 number of second filters 208-1 . . . 208-($n$−1) are connected in multiple stages between input/output terminals 206-1 and 206-2. In the first filter 207, a first resonator 201 and a capacitor 205 connected in parallel to the first resonator 201 are placed in a serial arm, and a second resonator 203 is placed in a parallel arm. Further, the second filters 208-1 . . . 208-($n$−1) are configured respectively with first resonators 202-1 . . . 202-($n$−1) placed in the serial arm and second resonators 204-1 . . . 204-($n$−1) placed in parallel arms.

Figure 4:
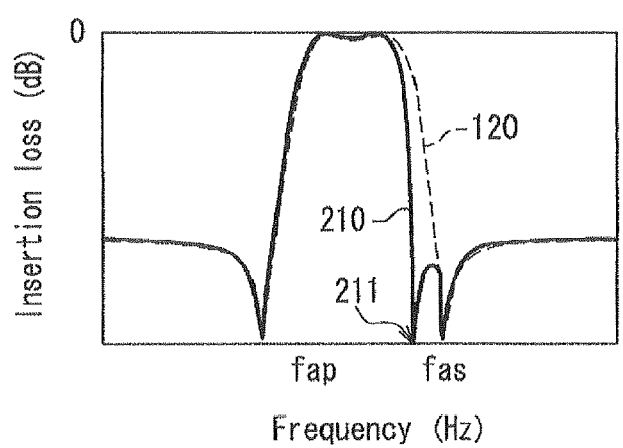
FIG. 4 is a graph illustrating frequency characteristics of insertion losses of other conventional ladder-type acoustic wave filters.

Since the capacitor 205 is connected in parallel, the anti-resonance point of the first resonator 201 shifts to the lower frequency side in comparison with the first resonator 202-1. Therefore, in the acoustic wave filter 200, the insertion loss characteristic of the first filter 207 is different from the insertion loss characteristics of the second filters 208-1 . . . 208-($n$−1), and as a whole the acoustic wave filer 200 has an insertion loss characteristic 210 as illustrated in FIG. 4. FIG. 4 is a graph illustrating the insertion loss characteristic 210 in the frequency of the acoustic wave filter 200. For the purpose of comparison, an insertion loss characteristic 120 of the acoustic wave filter 100 illustrated in FIG. 1 is indicated with a dashed line.

At the higher frequency side of the passband, the insertion loss characteristic 210 of the acoustic wave filter 200 has a new extremum 211 at a lower frequency side in comparison with the extremum in the insertion loss characteristic 120 of the acoustic wave filter 100. This is caused by the difference in the anti-resonance points between the first resonator 201 to which the capacitor 205 is connected in parallel and the first resonator 202-1 to which the capacitor 205 is not connected, in the acoustic wave filter 200. Therefore, in the insertion loss characteristic 210 of the acoustic wave filter 200, a steep filter characteristic is obtained at the higher frequency side of the passband.

Hereinafter, acoustic wave filters according to embodiments of the present application, a duplexer using the same, and a communication apparatus using the duplexer, will be described with reference to the attached drawings.

Embodiment 1

Figure 5:
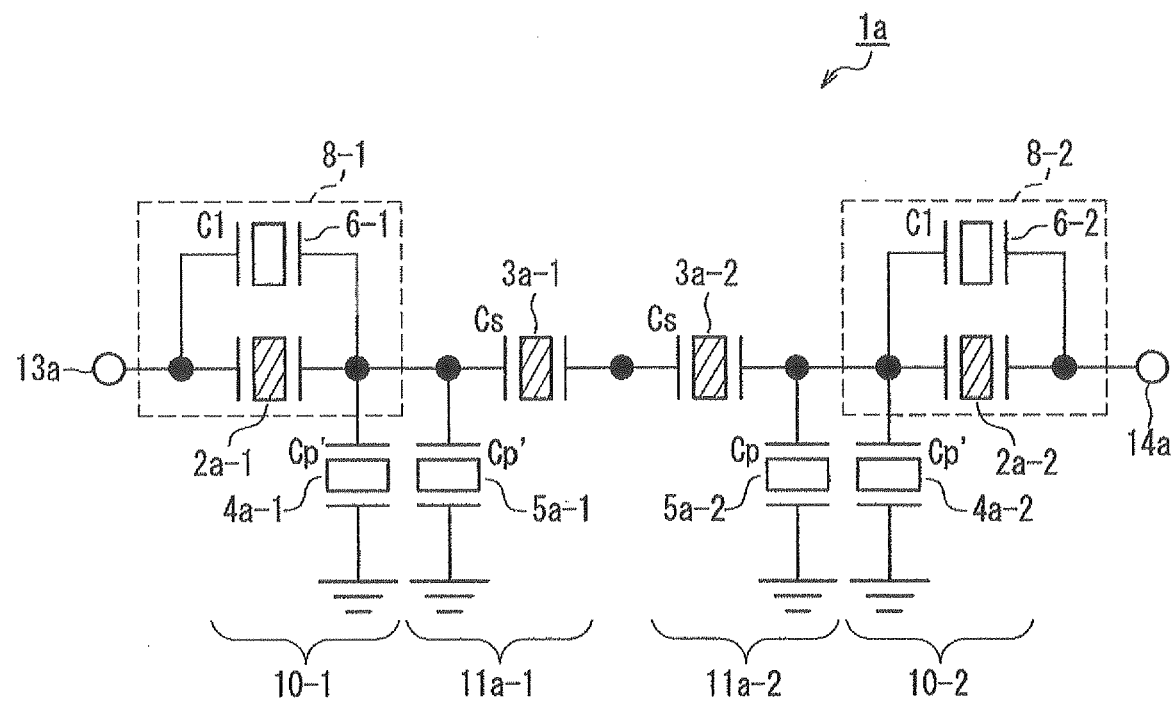
FIG. 5 is a circuit diagram illustrating a configuration of an acoustic wave filter according to Embodiment 1 of the present application.

FIG. 5 is a circuit diagram showing a configuration of a ladder-type acoustic wave filter 1a according to Embodiment 1 of the present application. In the acoustic wave filter 1a, first filters 10-1 and 10-2 are placed in the first and fourth stages and second filters 11a-1 and 11a-2 are placed in the second and third stages, between an input terminal 13a and an output terminal 14a when viewed from the input terminal 13a side, and the filters are cascaded respectively. The first filters 10-1, 10-2 and the second filters 11a-1, 11a-2 are bandpass filters.

The first filter 10-1 has a composite resonator 8-1 placed in a serial arm and a second resonator 4a-1 placed in a parallel arm. The composite resonator 8-1 is configured with a first resonator 2a-1 and a third resonator 6-1 connected in parallel to the first resonator 2a-1. Similarly, the first filter 10-2 has a composite resonator 8-2 placed in the serial arm, and a second resonator 4a-2 placed in a parallel arm. The composite resonator 8-2 is configured with a first resonator 2a-2, and a third resonator 6-2 connected in parallel to the first resonator 2a-2.

The second filter 11a-1 has a first resonator 3a-1 placed in the serial arm and a second resonator 5a-1 placed in a parallel arm. Similarly the second filter 11a-2 has a first resonator 3a-2 placed in the serial arm and a second resonator 5a-2 placed in a parallel arm.

The first resonators 2a-1, 2a-2, 3a-1, 3a-2 have a resonance frequency $f_{rs}$ and an anti-resonance frequency $f_{as}$. The second resonators 4a-1, 4a-2, 5a-1, 5a-2 and the third resonators 6-1, 6-2 have a resonance frequency $f_{rp}$ and an anti-resonance frequency $f_{ap}$. The resonance frequency $f_{rs}$ is higher than the resonance frequency $f_{rp}$, and the anti-resonance frequency $f_{as}$ is higher than the anti-resonance frequency $f_{ap}$. Further, the anti-resonance frequency $f_{as}$ is a frequency of the substantially same level as the resonance frequency $f_{rp}$.

The first resonators 2a-1, 2a-2, 3a-1, 3a-2, the second resonators 4a-1, 4a-2, 5a-1, 5a-2, and the third resonators 6-1, 6-2 are configured with FBAR. FBAR includes a piezoelectric film placed between two electrodes and has capacitance. The capacitance of the first resonators 3a-1, 3a-2 of the second filters 11a-1, 11a-2 is Cs. The capacitance of the second resonators 5a-1, 5a-2 of the second filters 11a-1, 11a-2 is Cp. The capacitance Cs of the first resonators 3a-1, 3a-2 and the capacitance Cp of the second resonators 5a-1, 5a-2 may be the substantially same level as those of the resonators of the conventional filters as illustrated in FIG. 1.

The capacitance of the first resonators 2a-1, 2a-2 of the first filters 10-1, 10-2 is Cs'. The capacitance of the second resonators 4a-1, 4a-2 of the first filters 10-1, 10-2 is Cp'. The capacitance of the third resonators 6-1, 6-2 of the first filters 10-1, 10-2 is C1. The capacitance Cs' of the first resonators 2a-1, 2a-2, the capacitance Cp' of the second resonators 4a-1, 4a-2, and the capacitance C1 of the third resonators 6-1, 6-2 are determined respectively such that the formulae (1)-(3) below will be established, $$Cs'=(1/m) \times Cs \quad \text{(Formula 1)}$$

$$Cp'=m \times Cp \quad \text{(Formula 2)}$$

$$C1=((1-m^2)/m) \times Cp \quad \text{(Formula 3)}$$

Here, m is larger than 0 and smaller than 1. Since the insertion loss in a band other than the passband tends to be decreased when m is smaller than 0.5, preferably m is at least 0.5. Due to this relation, the impedance of the acoustic wave filter 1a may be kept constant even if m is modified. Namely by using this relation, circuit designing may be conducted referring only to Cs, Cp and m as parameters.

The capacitance of a resonator is determined by the area of the resonator (area of a region where an upper electrode and a lower electrode overlap each other). Therefore, the capacitances of the first resonator, the second resonator and the third resonator are determined by applying the formulae (1)-(3), with the overlapping areas of an upper electrode 35 and a lower electrode 33, as illustrated in FIG. 6 and as described below.

Figure 6:
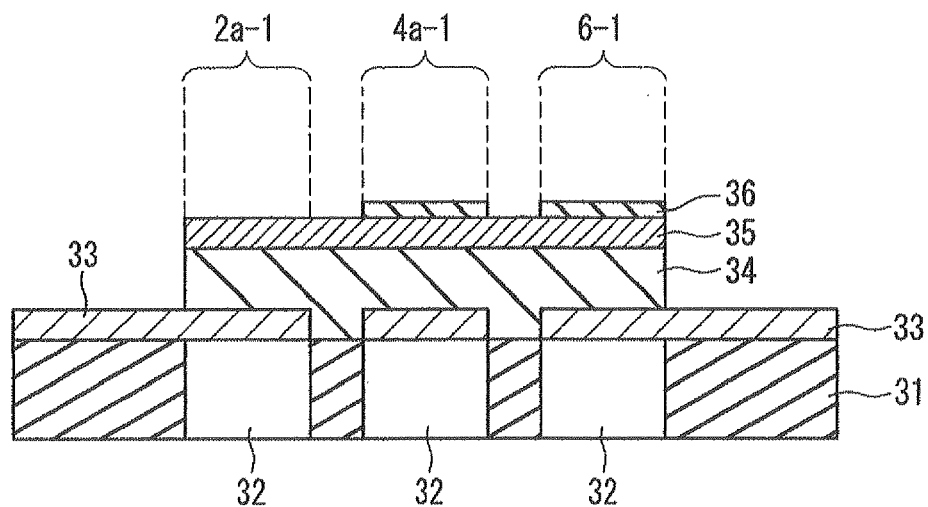
FIG. 6 is a cross-sectional view illustrating a configuration of a resonator that configures an acoustic wave filter according to Embodiment 1 of the present application.

FIG. 6 is a cross-sectional view illustrating a case where the first resonator 2a-1 and the second resonator 4a-1 configuring the first filter 10-1 of the acoustic wave filter 1a are formed on a single substrate. For a substrate 31, a silicon substrate or a quartz substrate is used. In the substrate 31, voids 32 are formed in the region on which the first resonator 2a-1, the second resonator 4a-1 and the third resonator 6-1 are to be formed. On the substrate 31, a lower electrode 33 is formed to cover the voids 32. On the lower electrode 33, a piezoelectric film 34 is formed. On the piezoelectric film 34, an upper electrode 35 is formed. In FIG. 6, the lower electrode 33 and the upper electrode 35 face each other at the first resonator 2a-1, the second resonator 4a-1 and the third resonator 6-1. As a result of applying a high-frequency voltage to the area between the lower electrode 33 and the upper electrode 35, functions of resonators are provided.

A mass load film 36 is formed on the upper electrode 35 at parts for the second resonator 4a-1 and the third resonator 6-1. Weight of the mass load film 36 is applied to the piezoelectric film 34 at the second resonator 4a-1 and at the third resonator 6-1. Therefore, the pressures applied to the piezoelectric film 34 at the second resonator 4a-1 and at the third resonator 6-1 become greater than the pressure applied to the piezoelectric film 34 at the first resonator 2a-1. As a result, the second resonator 4a-1 and the third resonator 6-1 have resonance frequencies lower than that of the first resonator 2a-1.

The first resonators 2a-2, 3a-1, 3a-2 have configurations similar to that of the first resonator 2a-1. The second resonators 4a-2, 5a-1, 5a-2 have configurations similar to that of the second resonator 4a-1, and the third resonator 6-2 has a configuration similar to that of the third resonator 6-1. All of these resonators are formed on the single substrate 31.

Figure 7A:
FIG. 7A is a cross-sectional view illustrating a step in manufacturing an acoustic wave filter according to Embodiment 1 of the present application.
Figure 7B:
FIG. 7B is a cross-sectional view illustrating a step subsequent to the step as illustrated in FIG. 7A.
Figure 7C:
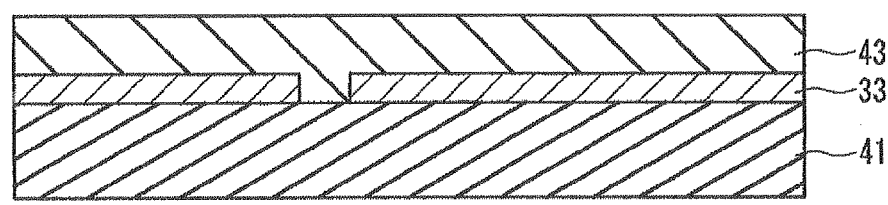
FIG. 7C is a cross-sectional view illustrating a step subsequent to the step as illustrated in FIG. 7B.
Figure 7D:
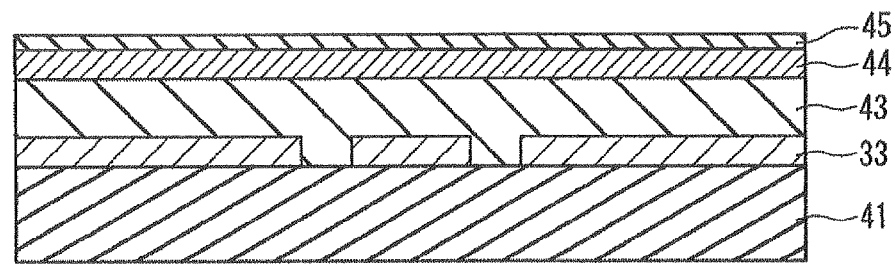
FIG. 7D is a cross-sectional view illustrating a step subsequent to the step as illustrated in FIG. 7C.

Next, a method of manufacturing the acoustic wave filter 1a will be described. FIGS. 7A-7H are cross-sectional views illustrating steps of manufacturing the acoustic wave filter 1a. First, as illustrated in FIG. 7A, a metal film 42 is formed by sputtering on a silicon substrate 41 in an Ar gas atmosphere under a pressure of 0.6 to 1.2 Pa. Next, as illustrated in FIG. 7B, the metal film 42 is etched by photolithography so as to form a lower electrode 33 of a desired shape. Next, as illustrated in FIG. 7C, an AlN film 43 is formed by sputtering on the lower electrode 33 and on the silicon substrate 41 by using an Al target in an Ar/$N_2$ gaseous mixture atmosphere under a pressure of about 0.3 Pa. Next, as illustrated in FIG. 7D, a metal film 44 is formed by sputtering on the AlN film 43, and further an insulating film 45 is formed by sputtering on the metal film 44, in an Ar gas atmosphere under a pressure of 0.6 to 1.2 Pa.

Figure 7E:
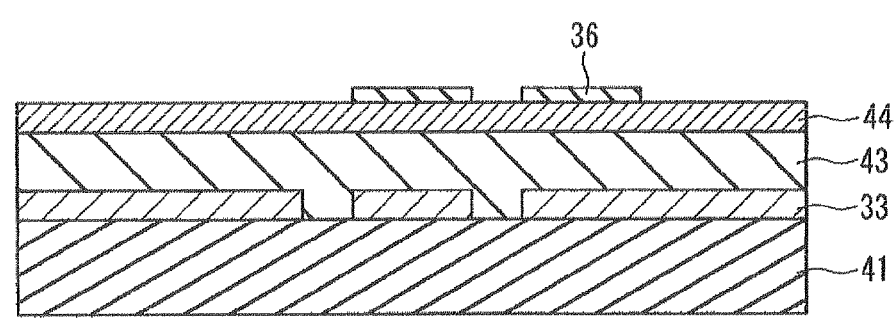
FIG. 7E is a cross-sectional view illustrating a step subsequent to the step as illustrated in FIG. 7D.
Figure 7F:
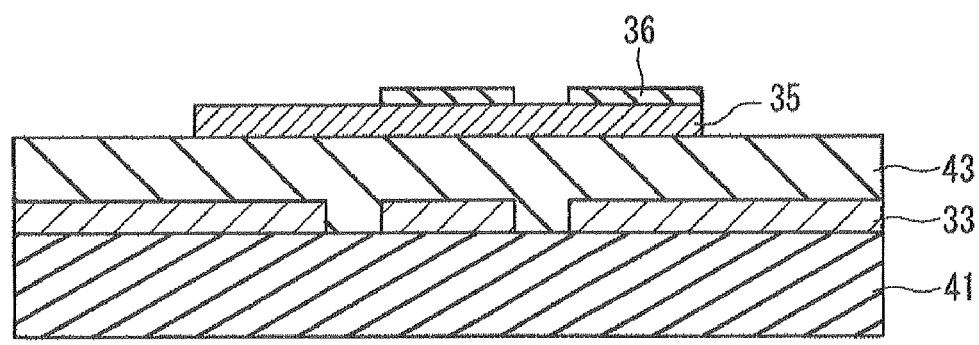
FIG. 7F is a cross-sectional view illustrating a step subsequent to the step as illustrated in FIG. 7E.

Next, as illustrated in FIG. 7E, the insulating film 45 is etched (wet-etched or dry-etched) to form a mass load film 36. Next, as illustrated in FIG. 7F, the metal film 44 is etched to form an upper electrode 35.

Figure 7G:
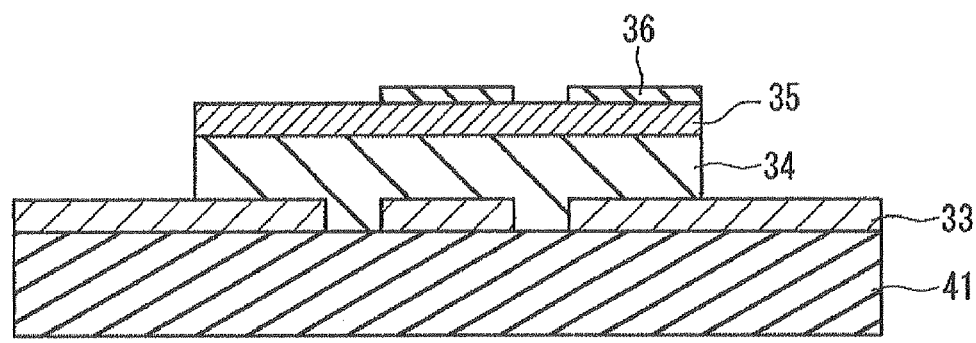
FIG. 7G is a cross-sectional view illustrating a step subsequent to the step as illustrated in FIG. 7F.
Figure 7H:
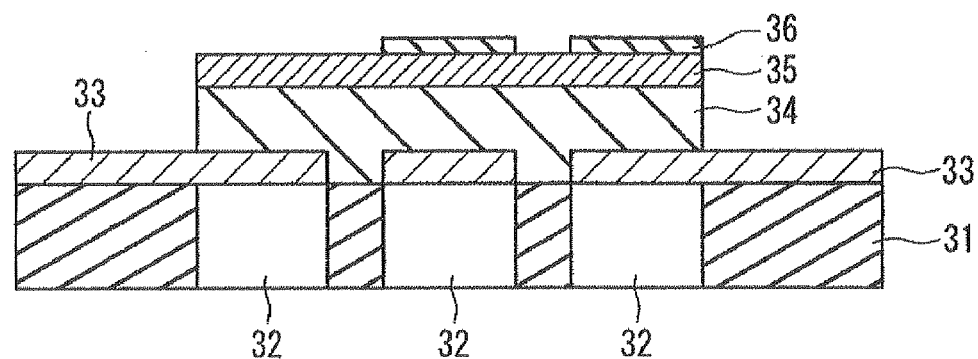
FIG. 7H is a cross-sectional view illustrating a step subsequent to the step as illustrated in FIG. 7G.

Next, as illustrated in FIG. 7G, the AlN film 43 is etched to form a piezoelectric film 34. Next, the silicon substrate 41 is dry-etched to remove the parts for the first resonator, the second resonator and the third resonator from the rear face so that the substrate 31 with the voids 32 as illustrated in FIG. 7H is formed. Though not illustrated, finally, the upper electrodes and the lower electrodes of the respective resonators are connected suitably so as to obtain the acoustic wave filter 1a.

Figure 8:
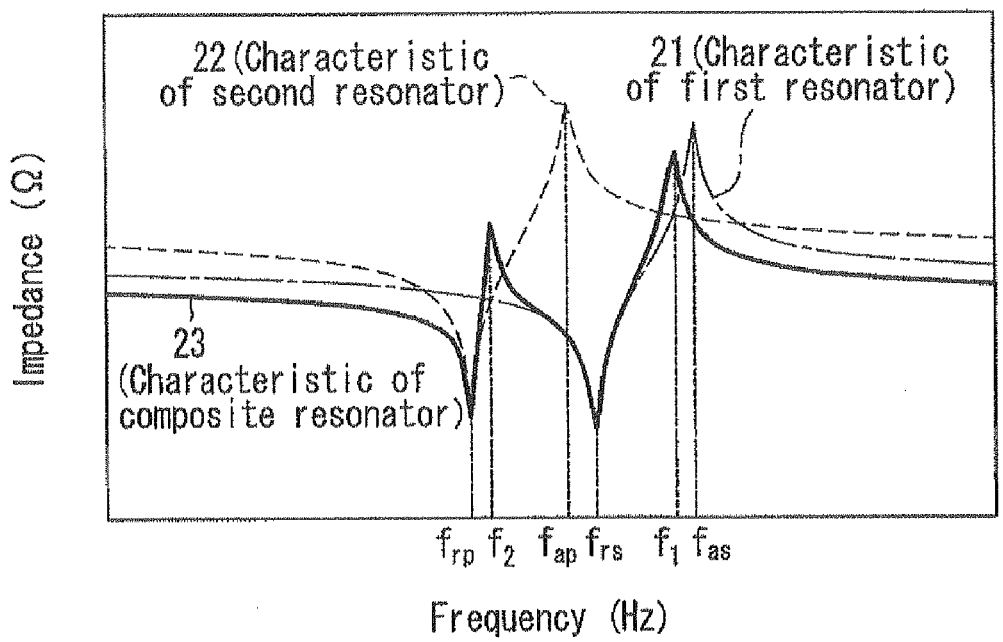
FIG. 8 is a graph illustrating frequency characteristics of impedances of resonators that configure an acoustic wave filter according to Embodiment 1 of the present application.

Next, the first filter 10-1 of the acoustic wave filter 1a illustrated in FIG. 5 will be described in detail. FIG. 8 is a graph illustrating the frequency characteristics of impedances of the resonators. A characteristic 21 denotes the characteristic of the first resonator 2a-1. A characteristic 22 denotes the characteristic of the second resonator 4a-1, and the third resonator 6-1 has a similar characteristic. A characteristic 23 denotes the characteristic of the composite resonator 8-1 configured with the first resonator 2a-1 and the third resonator 6-1. In the characteristic 21, the impedance of the first resonator 2a-1 becomes minimal (resonance) at the resonance frequency $f_{rs}$, and becomes maximal (anti-resonance) at the resonance frequency $f_{as}$. In the characteristic 22, the impedance of the second resonator 4a-1 becomes minimal (resonance) at the resonance frequency $f_{rp}$ and becomes maximal (anti-resonance) at the anti-resonance frequency $f_{ap}$.

In the characteristic 23, the impedance of the composite resonator 8-1 becomes minimal (resonance) at the resonance frequency $f_{rs}$ of the first resonator 2a-1 and at the resonance frequency $f_{rp}$ of the third resonator 6-1. And the impedance of the composite resonator 8-1 becomes maximal (anti-resonance) at a frequency f1 that is lower than the anti-resonance frequency $f_{as}$ of the first resonator 2a-1, and at a frequency f2 that is lower than the anti-resonance frequency $f_{ap}$ of the third resonator 6-1.

The impedance of the composite resonator 8-1 becomes maximal at the frequency f1, since in the vicinity of the anti-resonance frequency $f_{as}$ of the first resonator 2a-1, the first resonator 2a-1 functions as a resonator in the frequency band and the third resonator 6-1 functions as a capacitor, so that the anti-resonance frequency is lowered. Similarly, the composite resonator 8-1 anti-resonates at the frequency f2, since in the frequency band in the vicinity of the anti-resonance frequency $f_{ap}$ of the third resonator 6-1, the first resonator 2a-1 functions as a capacitor and the third resonator 6-1 functions as a resonator, so that the anti-resonance frequency is lowered.

Figure 9:
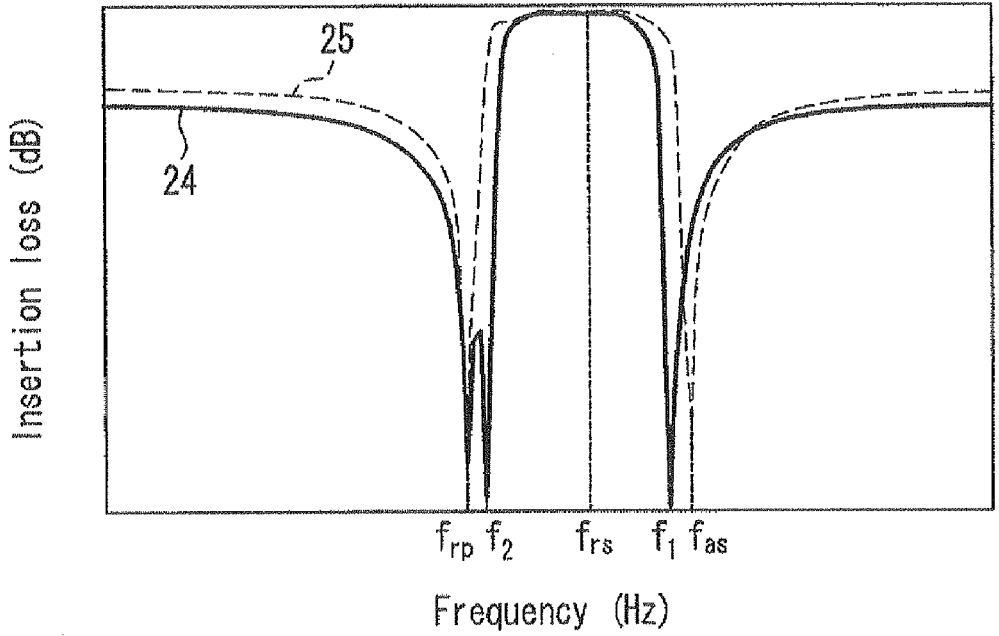
FIG. 9 is a graph illustrating a frequency characteristic of an insertion loss of a first filter that configures an acoustic wave filter according to Embodiment 1 of the present application.

FIG. 9 is a graph illustrating a frequency characteristic 24 of the insertion loss of the first filter 10-1 including the composite resonator 8-1 having the characteristic 23 and placed on the serial arm, and the second resonator 4a-1 placed in the parallel arm. For comparison, a characteristic 25 for one stage of the conventional ladder-type acoustic wave filter 100 illustrated in FIG. 1 is indicated with a dashed line in FIG. 9.

The characteristic 24 has an extremum at the frequency f2 as well as at the frequency $f_{rp}$. As having the extremum at the frequency f2, the characteristic 24 has a filter characteristic steeper than the conventional characteristic 25 at the lower frequency side of the passband of the characteristic 24, as described below. As indicated with the characteristic 23 in FIG. 8, the impedance of the composite resonator 8-1 becomes analogous to the impedance of the first resonator 2a-1 indicated with the characteristic 21, in the range from the frequency f2 as the anti-resonance frequency to the frequency $f_{rs}$ as the resonance frequency. Namely, as illustrated in FIG. 9, the characteristic 24 of the acoustic wave filter 1a becomes analogous to the characteristic 25 of the conventional acoustic wave filter 100 illustrated in FIG. 1, in the range from the frequency f2 to the frequency $f_{rs}$ as the resonance frequency resulting in the steep cut-off characteristic of the filter.

With this configuration, the filter cut-off characteristic may be made steep even with only one stage of the first filter 10-1.

Further, the extremum of the characteristic 24, which corresponds to the extremum that the characteristic 25 has at the frequency $f_{as}$, is shifted to the lower frequency f1.

As described above, the acoustic wave filter according to the present embodiment has a steep cut-off characteristic at the lower frequency side of the passband, without adding any external components or any new manufacturing steps. Therefore, the frequency band may be utilized effectively.

Embodiment 2

Figure 10:
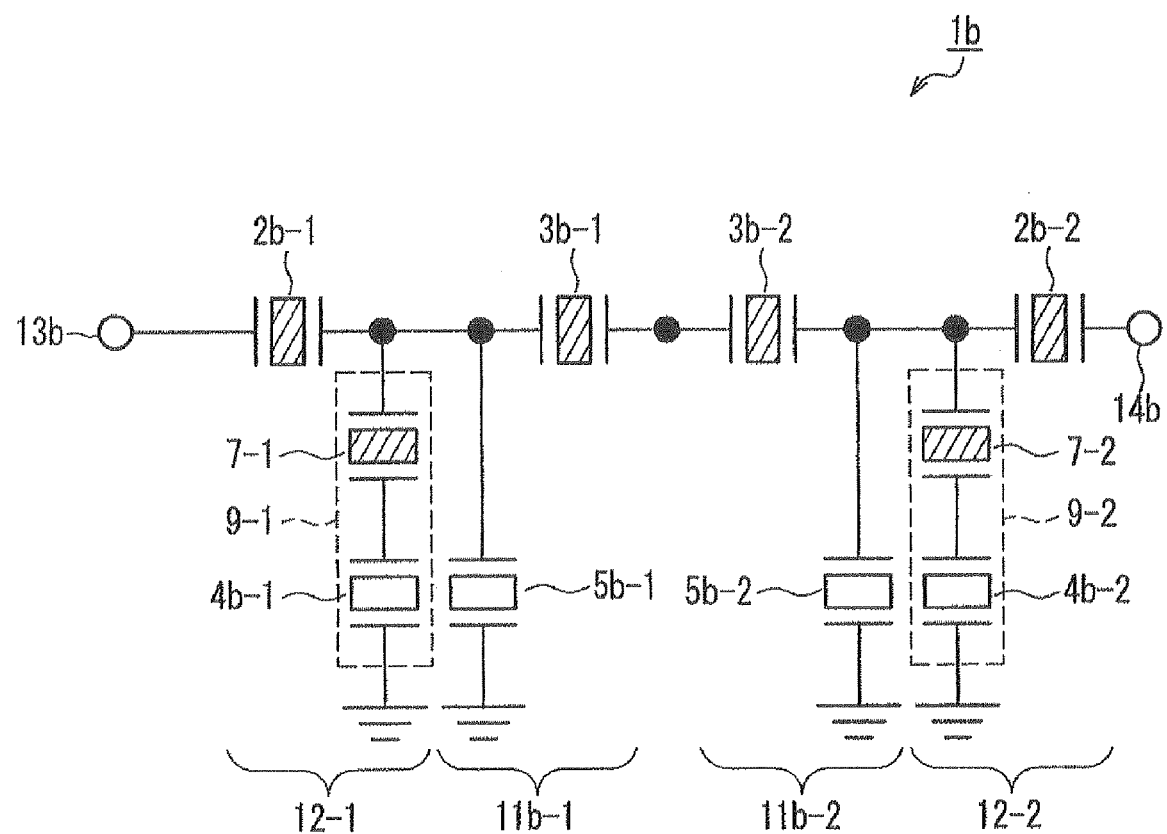
FIG. 10 is a circuit diagram illustrating a configuration of an acoustic wave filter according to Embodiment 2 of the present application.

FIG. 10 is a circuit diagram illustrating the configuration of a ladder-type acoustic wave filter 1b according to Embodiment 2 of the present application. In the acoustic wave filter 1b, third filters 12-1, 12-2 are placed in the first and fourth stages and second filters 11b-1, 11b-2 are placed in the second and third stages, between an input terminal 13b and an output terminal 14b when viewed from the input terminal 13b side, and the filters are cascaded respectively. The third filters 12-1, 12-2 and the second filters 11b-1, 11b-2 are bandpass filters.

The third filter 12-1 has a first resonator 2b-1 placed in a serial arm and a composite resonator 9-1 placed in a parallel arm. The composite resonator 9-1 is configured with a second resonator 4b-1 and a fourth resonator 7-1 connected in series to the second resonator 4b-1. Similarly, the third filter 12-2 has a first resonator 2b-2 placed in the serial arm and a composite resonator 9-2 placed in a parallel arm. The composite resonator 9-2 is configured with a second resonator 4b-2 and a fourth resonator 7-2 connected in series to the second resonator 4b-2.

The second filter 11b-1 has a first resonator 3b-1 placed in the serial arm and a second resonator 5b-1 placed in a parallel arm. Similarly, the second filter 11b-2 has a first resonator 3b-2 placed in the serial arm and a second resonator 5b-2 placed in a parallel arm.

The first resonators 2b-1, 2b-2, 3b-1, 3b-2 and the fourth resonators 7-1, 7-2 have a resonance frequency $f_{rs}$ and an anti-resonance frequency $f_{as}$. The second resonators 4b-1, 4b-2, 5b-1, 5b-2 have a resonance frequency $f_{rp}$ and an anti-resonance frequency $f_{ap}$. The resonance frequency $f_{rs}$ is higher than the resonance frequency $f_{rp}$, and the anti-resonance frequency $f_{as}$ is higher than the anti-resonance frequency $f_{ap}$. And the anti-resonance frequency $f_{as}$ is a frequency of the substantially same level as the resonance frequency $f_{rp}$.

The first resonators 2b-1, 2b-2, 3b-1, 3b-2, the second resonators 4b-1, 4b-2, 5b-1, 5b-2, and the fourth resonators 7-1, 7-2 are configured with FBAR. FBAR includes a piezoelectric film placed between two electrodes and has capacitance. The capacitance of the first resonators 3b-1, 3b-2 of the second filters 11b-1, 11b-2 is Cs. The capacitance of the second resonators 5b-1, 5b-2 of the second filters 11b-1, 11b-2 is Cp. The capacitance Cs of the first resonators 3b-1, 3b-2 and the capacitance Cp of the second resonators 5b-1, 5b-2 may be the substantially same level as those of the resonators of the conventional filters as illustrated in FIG. 1.

The capacitance of the first resonators 2b-1, 2b-2 of the third filters 12-1, 12-2 is Cs'. The capacitance of the second resonators 4b-1, 4b-2 of the third filters 12-1, 12-2 is Cp'. The capacitance of the fourth resonators 7-1, 7-2 of the third filters 12-1, 12-2 is C2. The capacitance Cs' of the first resonators 2b-1, 2b-2, the capacitance Cp' of the second resonators 4b-1, 4b-2, and the capacitance C2 of the third resonators 7-1, 7-2 are determined respectively such that the formulae (4)-(6) below will be established.

$$Cs' = (1/m) \times Cs \quad \text{(Formula 4)}$$

$$Cp' = m \times Cp \quad \text{(Formula 5)}$$

$$C2 = ((1-m^2)/m) \times Cp \quad \text{(Formula 6)}$$

Here, m is larger than 0 and smaller than 1. Since the insertion loss in the band other than the passband tends to be decreased when m is smaller than 0.5, preferably m is at least 0.5. Due to this relation, the impedance of the acoustic wave filter 1b may be kept constant even if m is modified. Namely, by using this relation, circuit designing may be conducted referring only Cs, Cp and m as parameters.

The configurations of first resonators 2b-1, 2b-2, 3b-1, 3b-2 and the fourth resonators 7-1, 7-2 are substantially the same as that of the first resonator 2a-1 illustrated in FIG. 6, and configurations of second resonators 4b-1, 4b-2, 5b-1, 5b-2 are substantially the same as that of the second resonator 4a-1 illustrated in FIG. 6, and thus a duplicated explanation is avoided. Similarly, the method for manufacturing the acoustic wave filter 1b is substantially the same as the method of manufacturing the acoustic wave filter la, and thus a duplicated explanation is avoided.

Figure 11:
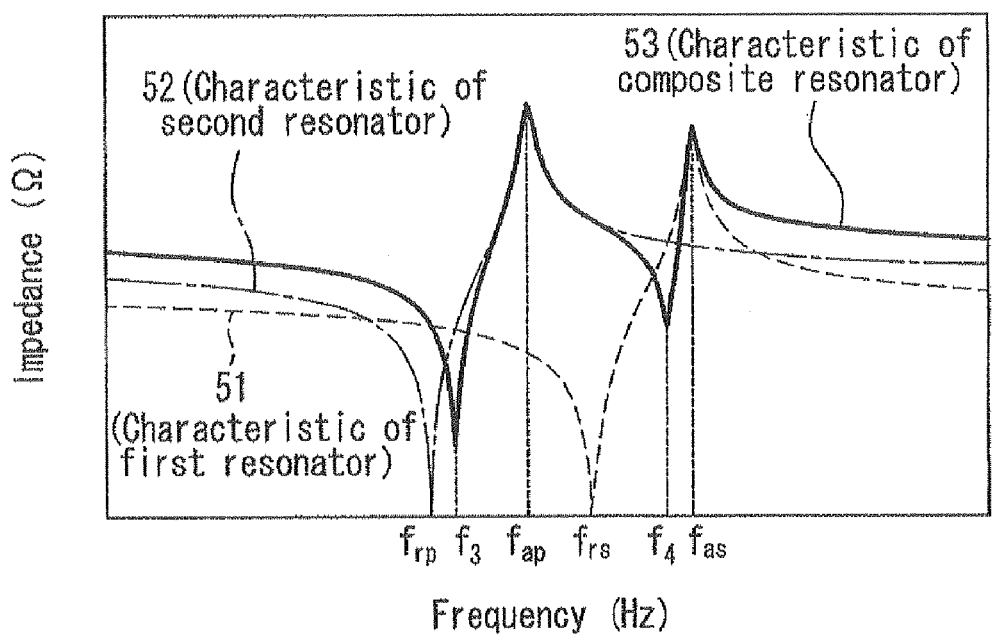
FIG. 11 is a graph illustrating frequency characteristics of impedances of resonators that configure an acoustic wave filter according to Embodiment 2 of the present application.

Next, the third filter 12-1 of the acoustic wave filter 1b illustrated in FIG. 10 will be described in detail. FIG. 11 is a graph illustrating the frequency characteristics of impedances of the resonators. A characteristic 51 denotes the characteristic of the first resonator 2b-1, and the fourth resonator 7-1 has a similar characteristic. A characteristic 52 denotes the characteristic of the second resonator 4b-1. A characteristic 53 denotes the characteristic of the composite resonator 9-1 configured with the second resonator 4b-1 and the fourth resonator 7-1. In the characteristic 51, the impedance of the first resonator 2b-1 becomes minimal (resonance) at the resonance frequency $f_{rs}$, and becomes maximal (anti-resonance) at the resonance frequency $f_{as}$. In the characteristic 52, the impedance of the second resonator 4b-1 becomes minimal (resonance) at the resonance frequency $f_{rp}$ and becomes maximal (anti-resonance) at the anti-resonance frequency $f_{ap}$.

In the characteristic 53, the impedance of the composite resonator 9-1 becomes maximal (anti-resonance) at the anti-resonance frequency $f_{as}$ of the second resonator 4b-1 and at the anti-resonance frequency $f_{ap}$ of the fourth resonator 7-1. And the impedance of the composite resonator 9-1 becomes minimal (resonance) at a frequency f3 higher than the resonance frequency $f_{rp}$ of the second resonator 4b-1, and at a frequency f4 higher than the resonance frequency $f_{rs}$ of the fourth resonator 7-1.

The impedance of the composite resonator 9-1 becomes minimal at the frequency f3, since the second resonator 4b-1 resonates in the frequency band in the vicinity of the resonance frequency $f_{rp}$ of the second resonator 4b-1 and the fourth resonator 7-1 functions as a capacitor, thereby raising the resonance frequency. Similarly, the composite resonator 9-1 resonates at the frequency f4, since in the frequency band in the vicinity of the resonance frequency $f_{rs}$ of the fourth resonator 7-1, the second resonator 4b-1 functions as a capacitor and the fourth resonator 7-1 resonates, thereby raising the resonance frequency.

Figure 12:
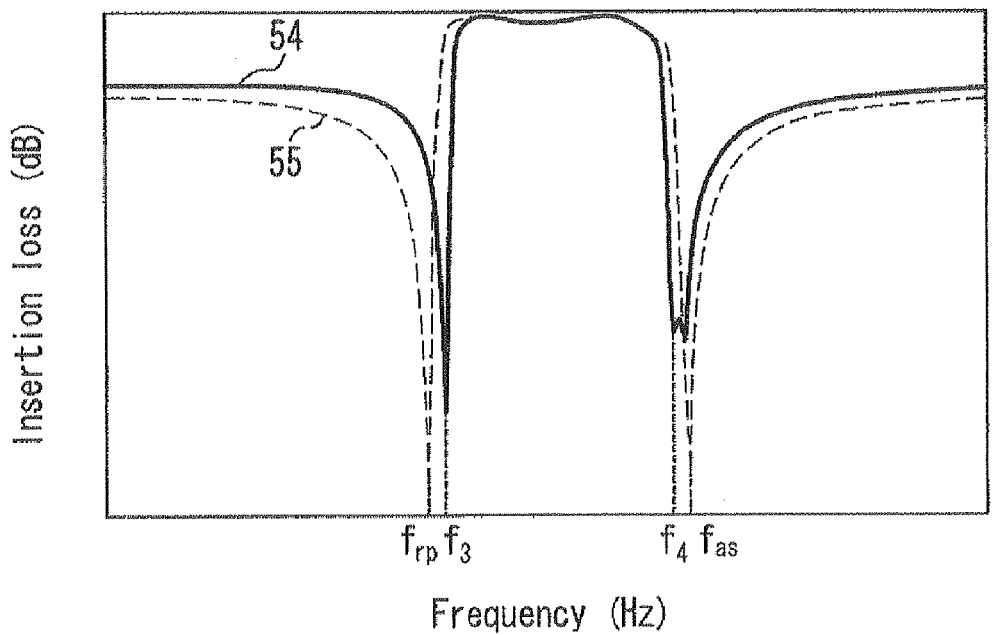
FIG. 12 is a graph illustrating a frequency characteristic of an insertion loss of a first filter that configures an acoustic wave filter according to Embodiment 2 of the present application.

FIG. 12 is a graph illustrating a frequency characteristic 54 of the insertion loss of the third filter 12-1 having the composite resonator 9-1 that has the characteristic 53 and that is placed in the parallel arm, and the first resonator 2b-1 that is placed in the serial arm. For comparison, a characteristic 55 for a single stage of the conventional ladder-type acoustic wave filter 100 is indicated with a dashed line in FIG. 12.

The characteristic 54 has an extremum at the frequency f4 as well as the frequency $f_{as}$. As having the extremum at the frequency f4, the characteristic 54 has a filter characteristic steeper than the conventional characteristic 55 at the higher frequency side of the passband of the characteristic 54, as described below. As indicated with the characteristic 53 in FIG. 11, the impedance of the composite resonator 9-1 becomes analogous to the impedance of the second resonator 4b-1 indicated with the characteristic 52, in the range from the frequency f4 as the resonance frequency to the frequency $f_{ap}$ as the anti-resonance frequency. Namely, as illustrated in FIG. 12, the characteristic 54 of the acoustic wave filter 1b becomes analogous to the characteristic 55 of the conventional acoustic wave filter 100 illustrated in FIG. 1, in the range from the frequency f4 to the frequency $f_{ap}$ as the anti-resonance frequency, resulting in the steep cut-off characteristic of the filter.

Further, the extremum of the characteristic 54, which corresponds to the extremum that the characteristic 55 has at the frequency $f_{rp}$, is shifted to the higher frequency f3.

As described above, the acoustic wave filter according to the present embodiment has a steep cut-off characteristic at the lower frequency side of the passband.

Though the explanation in Embodiments 1 and 2 refers to cases where the first filters 10-1, 10-2, the second filters 11a-1, 11a-2, 11b-1, 11b-2 and the third filters 12-1, 12-2 are ladder-type acoustic wave filters, the present application is not limited to these examples. Similar effects may be obtained with lattice-type acoustic wave filters, for example.

Further, though the explanations in Embodiments 1 and 2 refer to examples where the resonators are FBAR, the resonators may be SAW or SMR, for example. Alternatively, the resonators may be bulk wave piezoelectric resonators to be formed on either one ferroelectric single-crystal substrate or one ferroelectric piezoelectric ceramic substrate. When using SAW, the capacitance is determined depending on the number of the combs of the comb-like electrode and the like.

In the examples described in Embodiments 1 and 2, the acoustic wave filters 1a, 1b are configured respectively with four-staged filters. However, the effect of improving the cut-off characteristic of the filters may be obtained irrespective of the number of the stages of filters as long as either the first filter or the third filter is included. Alternatively, either the first filters or the third filters may be connected in multiple stages.

Embodiment 3

Figure 13:
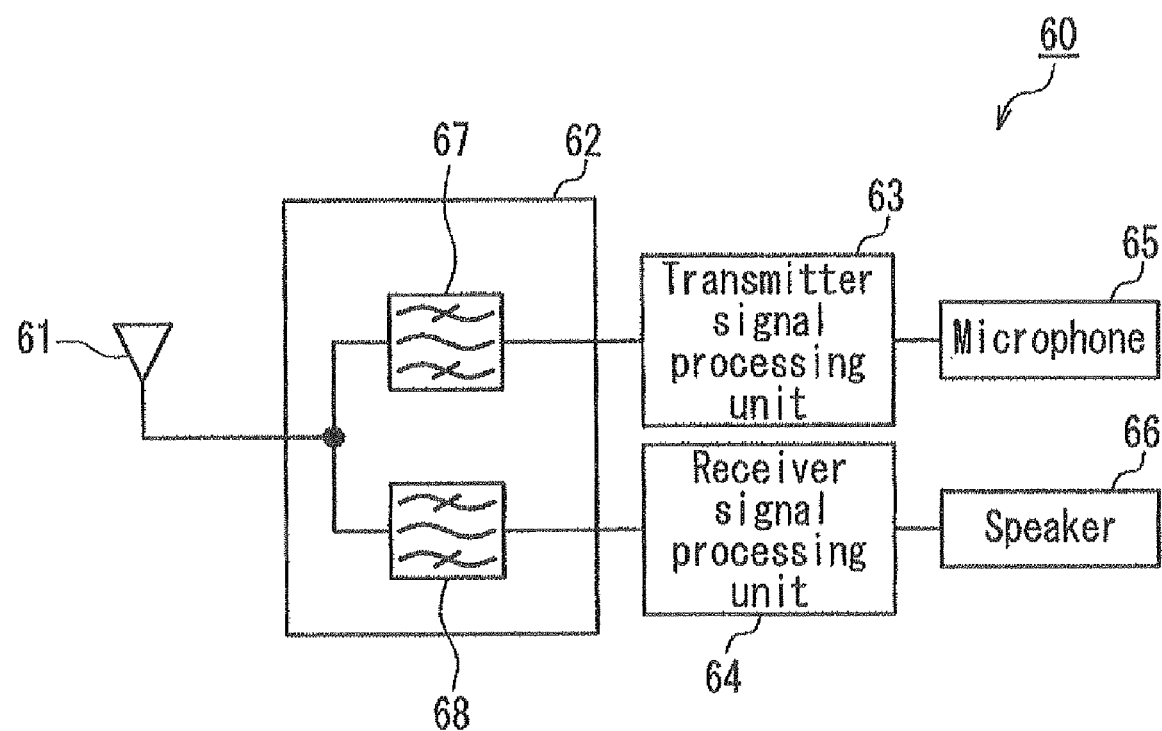
FIG. 13 is a block diagram illustrating a configuration of a communication apparatus according to Embodiment 3 of the present application.

FIG. 13 is a diagram for illustrating a communication apparatus 60 according to Embodiment 3 of the present application. The communication apparatus 60 has an antenna 61, a duplexer 62, a transmitter signal processing unit 63, a receiver signal processing unit 64, a microphone 65, and a speaker 66. The duplexer 62 has a transmission filter 67 and a reception filter 68 that are formed with the acoustic wave filter of Embodiment 1 or 2. The reception filter 68 has a passband (reception band) different from the passband of the transmission filter 67.

The microphone 65 converts a voice into a voice signal, and inputs the voice signal into the transmitter signal processing unit 63. The transmitter signal processing unit 63 modulates the voice signal so as to generate a transmission signal. The duplexer 62 inputs the transmission signal generated in the transmitter signal processing unit 63 into the antenna 61.

The antenna 61 converts the transmission signal into a radio wave and outputs. And the antenna 61 converts the radio wave into a reception signal as an electric signal, and inputs the reception signal into the duplexer 62. In the duplexer 62, the reception filter 68 passes a reception signal in a reception band, and input it into the receiver signal processing unit 64. On the other hand, the transmission filter 67 does not pass the reception signal since the passband is different from the reception band. Therefore, the reception signal is not inputted into the transmitter signal processing unit 63. The receiver signal processing unit 64 subjects the reception signal with processes such as demodulation and amplification, thereby generating a voice signal. The speaker 66 converts the voice signal into a voice and outputs.

Figure 14:
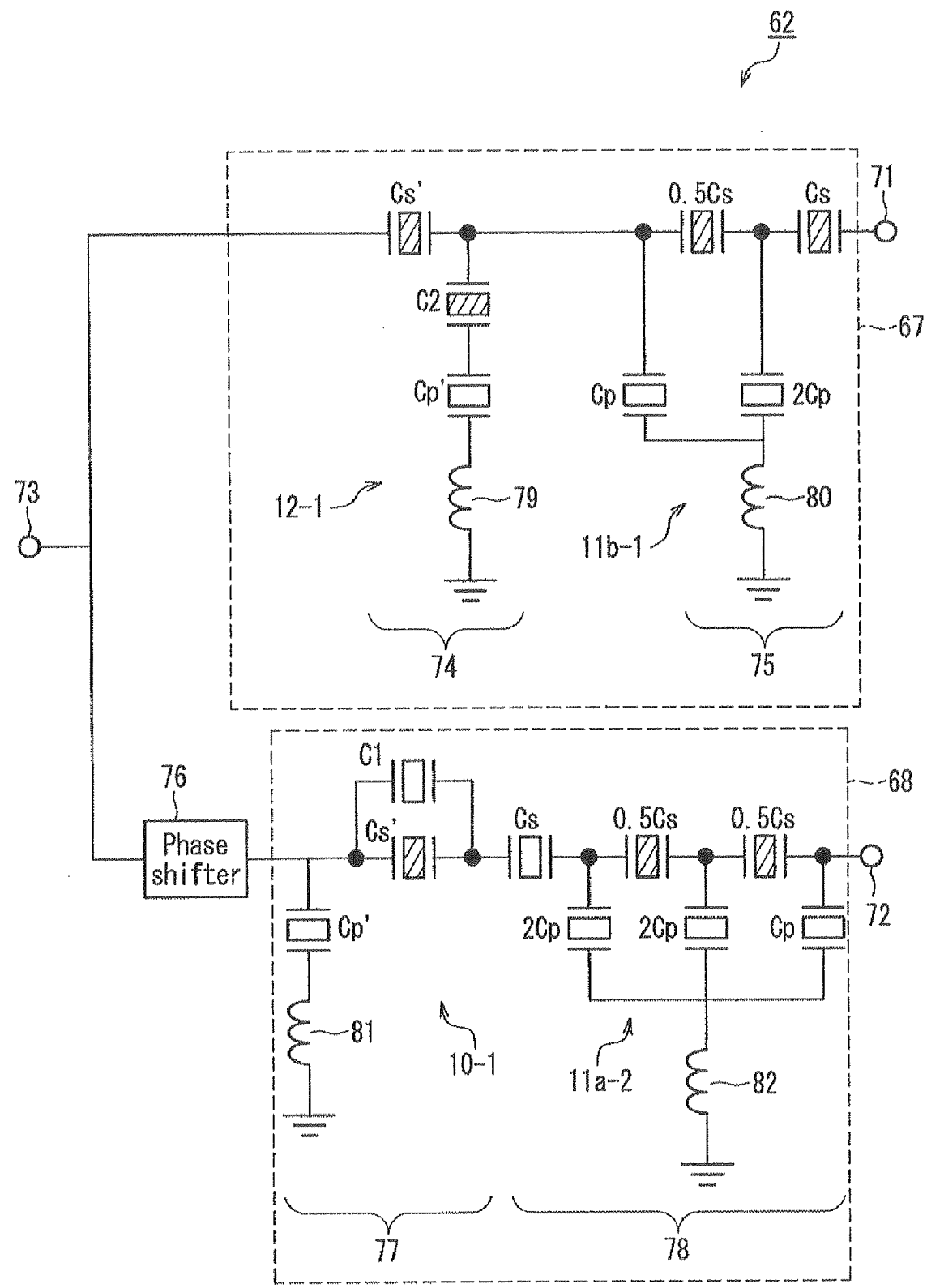
FIG. 14 is a circuit diagram illustrating a configuration of a duplexer according to Embodiment 3 of the present application.

FIG. 14 is a circuit diagram illustrating the configuration of the duplexer 62 of the present application. An antenna port 73 is connected to a transmission port 71 and a reception port 72. The antenna port 73 may be connected to the antenna 61 illustrated in FIG. 13. The transmission port 71 may be connected to the transmitter signal processing unit 63 illustrated in FIG. 13. And the reception port 72 may be connected to the receiver signal processing unit 64 illustrated in FIG. 13.

The transmission filter 67 is placed between the transmission port 71 and the antenna port 73. The transmission filter 67 includes a filter 74 and a filter 75 connected to each other. The filter 74 has the third filter 12-1 described in Embodiment 2 and a coil 79 connected to a parallel arm. The filter 75 has the second filter 11b-1 connected in multiple stages and a coil 80 connected to the parallel arm.

Here, a resonator having capacitance of 0.5 Cs is obtained by connecting in series two resonators having capacitance of Cs, and a resonator having capacitance of 2 Cp is obtained by connecting in parallel two resonators having capacitance of Cp. Therefore, the filter 75 is configured by connecting three-stages of the second filters 11b-1. The transmission filter 67 is the ladder-type acoustic wave filter 1b described in Embodiment 2, which has the third filter 12-1 and the second filter 11b-1 connected in multiple stages. Here, the coils 79 and 80 placed in the parallel arms are inductance components of the package.

The reception filter 68 and a phase shifter 76 are placed between the antenna port 73 and the reception port 72. The phase shifter 76 shifts the phase of the signal inputted from the antenna port 73. The reception filter 68 is configured by connecting a filter 77 and a filter 78. The filter 77 has the first filter 10-1 described in Embodiment 1 and a coil 81 connected to a parallel arm. The filter 78 has the second filters 11a-2 connected in five stages and a coil 82. Namely, the reception filter 68 is the ladder-type acoustic wave filter 1a described in Embodiment 1, which is provided by connecting the first filter 10-1 and the second filter 11a-1 in multiple stages. Here, the coils 81 and 82 placed in the parallel arms are inductance components of the package.

Figure 15A:
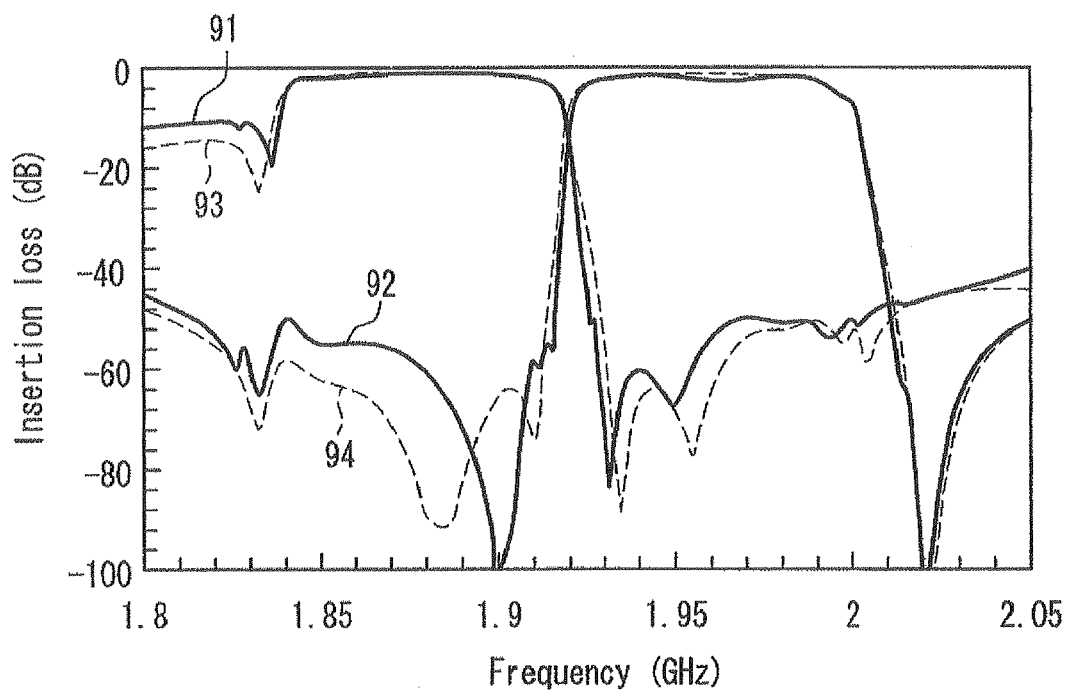
FIG. 15A is a graph illustrating characteristics of a duplexer according to Embodiment 3 of the present application.
Figure 15B:
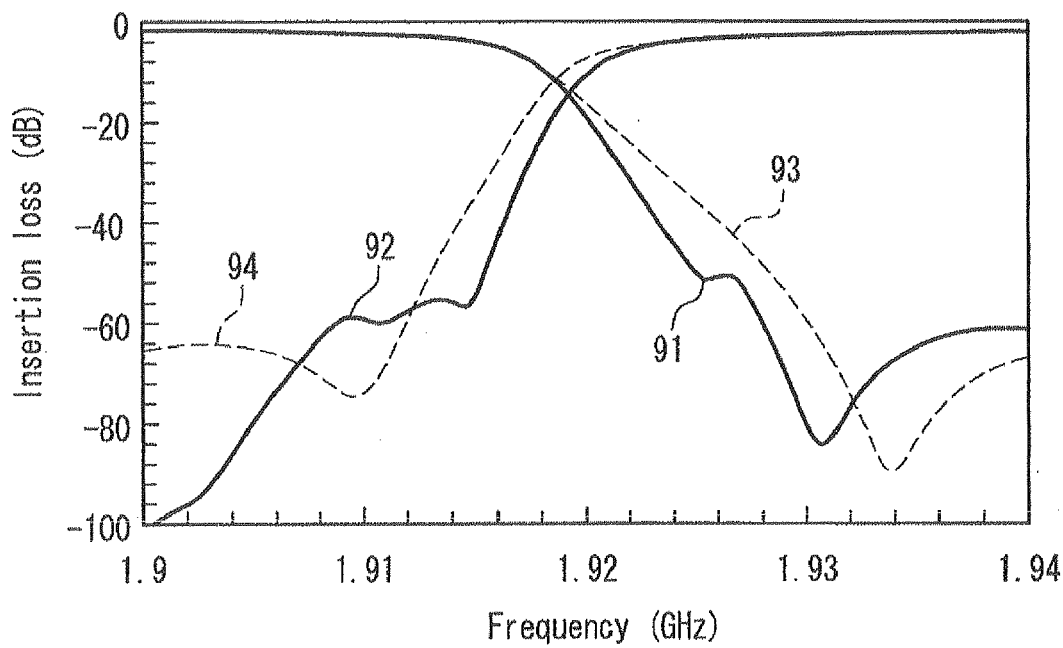
FIG. 15B is a partially-enlarged view of FIG. 15A.

The reception filter 68 has a passband different from the passband of the transmission filter 67. FIG. 15A is a graph illustrating frequency characteristics 91, 92 of the respective insertion losses of the transmission filter 67 and the reception filter 68. For comparison, frequency characteristics 93, 94 of the respective insertion losses of the transmission filter and the reception filter formed with the conventional filters illustrated in FIG. 1 are indicated with dashed lines. FIG. 15B is an enlarged graph illustrating the frequency range from 1.9 GHz to 1.94 GHz of FIG. 15A.

The passband of the transmission filter 67 is located at the lower frequency side in comparison with the passband of the reception filter 68. As a result of configuring the transmission filter 67 with the acoustic wave filter 1b, the characteristic 91 has a steep cut-off characteristic at the higher frequency side of the passband. Further, as a result of configuring the reception filter 68 with the acoustic wave filter 1a, the characteristic 92 has a steep cut-off characteristic at the lower frequency side of the passband For this reason, even if the passband of the transmission filter 67 and the passband of the reception filter 68 are made analogous to each other, for example, a transmission signal will not enter the receiver signal processing unit 64 illustrated in FIG. 13. Therefore, by making the passband of the transmission filter 67 and the passband of the reception filter 68 analogous to each other, the frequency band to be used may be narrowed and the frequency band may be utilized effectively.

The present application has an effect of a steep cut-off characteristic of a filter, and may be applied to an acoustic wave filter, a duplexer, a communication apparatus and the like.

(Supplementary Note 1)

An acoustic wave filter comprising:

a first resonator that is placed in a serial arm and that has a resonance frequency $f_{rs}$ and an anti-resonance frequency $f_{as}$; and a second resonator that is placed in a parallel arm and that has a resonance frequency $f_{rp}$ and an anti-resonance frequency $f_{ap}$, the first resonator and the second resonator are formed on a same substrate;

the resonance frequency $f_{rs}$ of the first resonator is higher than the resonance frequency $f_{rp}$ of the second resonator; and the anti-resonance frequency $f_{as}$ of the first resonator is higher than the anti-resonance frequency $f_{ap}$ of the second resonator, the acoustic wave filter comprises a third resonator that is connected to the serial arm in parallel with respect to the first resonator and that has a resonance frequency $f_{rp}$ and an anti-resonance frequency $f_{ap}$; and the third resonator is formed on the substrate.

(Supplementary Note 2)

An acoustic wave filter comprising:

a first resonator that is placed in a serial arm and that has a resonance frequency $f_{rs}$ and an anti-resonance frequency $f_{as}$; and a second resonator that is placed in a parallel arm and that has a resonance frequency $f_{rp}$ and an anti-resonance frequency $f_{ap}$, the first resonator and the second resonator are formed on a same substrate;

the resonance frequency $f_{rs}$ of the first resonator is higher than the resonance frequency $f_{rp}$ of the second resonator; and the anti-resonance frequency $f_{as}$ of the first resonator is higher than the anti-resonance frequency $f_{ap}$ of the second resonator, the acoustic wave filter comprises a fourth resonator that is connected to the parallel arm in series with respect to the second resonator and that has a resonance frequency $f_{rs}$ and an anti-resonance frequency $f_{as}$; and the fourth resonator is formed on the substrate.

(Supplementary Note 3)

An acoustic wave filter comprising:

a plurality of filters on a same substrate, each of the filters having a first resonator that is placed in a serial arm and that has a resonance frequency $f_{rs}$ and an anti-resonance frequency $f_{as}$, and a second resonator that is placed in a parallel arm and that has a resonance frequency $f_{rp}$ and an anti-resonance frequency $f_{ap}$, the resonance frequency $f_{rs}$ of the first resonator is higher than the resonance frequency $f_{rp}$ of the second resonator;

the anti-resonance frequency $f_{as}$ of the first resonator is higher than the anti-resonance frequency $f_{ap}$ of the second resonator; and the filters are connected in multiple stages, at least one of the filters connected in multiple stages has a third resonator whose resonance frequency is $f_{rp}$ and whose anti-resonance frequency is $f_{ap}$, the third resonator is formed on the substrate and connected to the serial arm in parallel with respect to the first resonator.

(Supplementary Note 4)

The acoustic wave filter according to Supplementary Note 3, wherein when Cs denotes capacitance of the first resonator of a filter that has no third resonator among the filters, Cp denotes capacitance of the second resonator of a filter that has no third resonator, and m denotes a parameter larger than 0 and smaller than 1, capacitance Cs' of the first resonator of a filter that has the third resonator, capacitance Cp' of the second resonator of a filter that has the third resonator, and capacitance C1 of the third resonator have the relationship represented by Formulae (1) to (3) below:

$$Cs'=(1/m)\times Cs \qquad (1)$$

$$Cp'=m\times Cp \qquad (2)$$

$$C1=((1-m^2)/m)\times Cp \qquad (3).$$

(Supplementary Note 5)

An acoustic wave filter comprising:

a plurality of filters each having a first resonator that is formed on a substrate and a second resonator that is formed on the substrate, where the plural filters provided on the same substrate, each having a first resonator that is placed in a serial arm and that has a resonance frequency $f_{rs}$ and an anti-resonance frequency $f_{as}$, and a second resonator that is placed in a parallel arm and that has a resonance frequency $f_{rp}$ and an anti-resonance frequency $f_{ap}$, the resonance frequency $f_{rs}$ of the first resonator is higher than the resonance frequency $f_{rp}$ of the second resonator;

the anti-resonance frequency $f_{as}$ of the first resonator is higher than the anti-resonance frequency $f_{ap}$ of the second resonator; and the plural filters are connected in multiple stages;

at least one of the filters connected in multiple stages has a fourth resonator whose resonance frequency is $f_{rs}$ and whose anti-resonance frequency is $f_{as}$, the fourth resonator is formed on the substrate and connected to the parallel arm in series with respect to the second resonator.

(Supplementary Note 6)

The acoustic wave filter according to Supplementary Note 5, wherein when Cs denotes capacitance of the first resonator of a filter that has no fourth resonator among the filters, Cp denotes capacitance of the second resonator of a filter that has no fourth resonator, and m denotes a parameter larger than 0 and smaller than 1, capacitance Cs' of the first resonator of a filter that has the fourth resonator, capacitance Cp' of the second resonator of a filter that has the fourth resonator, and capacitance C2 of the fourth resonator have the relationship represented by Formulae (4) to (6) below:

$$Cs'=(1/m)\times Cs \qquad (4)$$

$$Cp'=m\times Cp \qquad (5)$$

$$C2=((1-m^2)/m)\times Cp \qquad (6).$$

(Supplementary Note 7)

The acoustic wave filter according to any one of Supplementary Notes 1, 3 and 4, wherein the first resonator, the second resonator, and the third resonator are either surface acoustic wave resonators or piezoelectric thin film resonators.

(Supplementary Note 8)

The acoustic wave filter according to any one of Supplementary Notes 2, 5 and 6, wherein the first resonator, the second resonator, and the fourth resonator are either surface acoustic wave resonators or piezoelectric thin film resonators.

(Supplementary Note 9)

The acoustic wave filter according to any one of Supplementary Notes 1, 3 and 4, wherein the substrate is either a ferroelectric single-crystal substrate or a ferroelectric piezoelectric ceramic substrate, and the first resonator, the second resonator and the third resonator are bulk wave piezoelectric resonators.

(Supplementary Note 10)

The acoustic wave filter according to any one of Supplementary Notes 2, 5 and 6, wherein the substrate is either a ferroelectric single-crystal substrate or a ferroelectric piezoelectric ceramic substrate, and the first resonator, the second resonator and the fourth resonator are bulk wave piezoelectric resonators.

(Supplementary Note 11)

A duplexer comprising:

a transmitter filter; and a receiver filter whose passing frequency band is different from the passing frequency band of the transmitter filter, the transmitter filter and the receiver filter are composed of the acoustic wave filters according to anyone of Supplementary Notes 1 to 10.

(Supplementary Note 12)

A communication apparatus comprising:

an antenna;

the duplexer according to Supplementary Note 11, which is connected to the antenna; and a signal processing unit connected to the duplexer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:

1. An acoustic wave filter comprising:

a first resonator that is placed in a serial arm and that has a resonance frequency $f_{rs}$ and an anti-resonance frequency $f_{as}$; and a second resonator that is placed in a parallel arm and that has a resonance frequency $f_{rp}$ and an anti-resonance frequency $f_{ap}$, the first resonator and the second resonator are formed on a same substrate;

the resonance frequency $f_{rs}$ of the first resonator is higher than the resonance frequency $f_{rp}$ of the second resonator; and the anti-resonance frequency $f_{as}$ of the first resonator is higher than the anti-resonance frequency $f_{ap}$ of the second resonator, the acoustic wave filter comprises a fourth resonator that is connected to the parallel arm in series with respect to the second resonator and that has a resonance frequency $f_{rs}$ and an anti-resonance frequency $f_{as}$; and the fourth resonator is formed on the substrate.

2. The acoustic wave filter according to claim 1, wherein the first resonator, the second resonator, and the fourth resonator are either surface acoustic wave resonators or piezoelectric thin film resonators.

3. A duplexer comprising:

a transmitter filter; and a receiver filter whose passing frequency band is different from the passing frequency band of the transmitter filter, at least one of the transmitter filter and the receiver filter includes the acoustic wave filter according to claim 1.

4. A communication apparatus comprising:

an antenna;

the duplexer according to claim 3, which is connected to the antenna; and a signal processing unit connected to the duplexer.

5. An acoustic wave filter comprising:

a plurality of filters on a same substrate, each of the filters having a first resonator that is placed in a serial arm and that has a resonance frequency $f_{rs}$ and an anti-resonance frequency $f_{as}$, and a second resonator that is placed in a parallel arm and that has a resonance frequency $f_{rp}$ and an anti-resonance frequency $f_{ap}$, the resonance frequency $f_{rs}$ of the first resonator is higher than the resonance frequency $f_{rp}$ of the second resonator;

the anti-resonance frequency $f_{as}$ of the first resonator is higher than the anti-resonance frequency $f_{ap}$ of the second resonator; and the filters are connected in multiple stages, at least one of the filters connected in multiple stages has a third resonator whose resonance frequency is $f_{rp}$ and whose anti-resonance frequency is $f_{ap}$, the third resonator is formed on the substrate and connected to the serial arm in parallel with respect to the first resonator.

6. The acoustic wave filter according to claim 5, wherein when Cs denotes capacitance of the first resonator of a filter that has no third resonator among the filters, Cp denotes capacitance of the second resonator of a filter that has no third resonator, and m denotes a parameter larger than 0 and smaller than 1, capacitance Cs' of the first resonator of a filter that has the third resonator, capacitance Cp' of the second resonator of a filter that has the third resonator, and capacitance C1 of the third resonator have the relationship represented by Formulae (1) to (3) below:

$$Cs' = (1/m) \times Cs \quad (1)$$

$$Cp' = m \times Cp \quad (2)$$

$$C1 = ((1-m^2)/m) \times Cp \quad (3).$$

7. The acoustic wave filter according to claim 6, wherein the first resonator, the second resonator, and the third resonator are either surface acoustic wave resonators or piezoelectric thin film resonators.

8. The acoustic wave filter according to claim 5, wherein the first resonator, the second resonator, and the third resonator are either surface acoustic wave resonators or piezoelectric thin film resonators.

9. An acoustic wave filter comprising:

a plurality of filters each having a first resonator that is formed on a substrate and a second resonator that is formed on the substrate, where the plural filters provided on the same substrate, each having a first resonator that is placed in a serial arm and that has a resonance frequency $f_{rs}$ and an anti-resonance frequency $f_{as}$, and a second resonator that is placed in a parallel arm and that has a resonance frequency $f_{rp}$ and an anti-resonance frequency $f_{ap}$, the resonance frequency $f_{rs}$ of the first resonator is higher than the resonance frequency $f_{rp}$ of the second resonator;

the anti-resonance frequency $f_{as}$ of the first resonator is higher than the anti-resonance frequency $f_{ap}$ of the second resonator; and the plural filters are connected in multiple stages;

at least one of the filters connected in multiple stages has a fourth resonator whose resonance frequency is $f_{rs}$ and whose anti-resonance frequency is $f_{as}$, the fourth resonator is formed on the substrate and connected to the parallel arm in series with respect to the second resonator.

10. The acoustic wave filter according to claim 9, wherein when Cs denotes capacitance of the first resonator of a filter that has no fourth resonator among the filters, Cp denotes capacitance of the second resonator of a filter that has no fourth resonator, and m denotes a parameter larger than 0 and smaller than 1, capacitance Cs' of the first resonator of a filter that has the fourth resonator, capacitance Cp' of the second resonator of a filter that has the fourth resonator, and capacitance C2 of the fourth resonator have the relationship represented by Formulae (4) to (6) below:

$$Cs' = (1/m) \times Cs \quad (4)$$

$$Cp' = m \times Cp \quad (5)$$

$$C2 = ((1-m^2)/m) \times Cp \quad (6).$$

11. The acoustic wave filter according to claim 10, wherein the first resonator, the second resonator, and the fourth resonator are either surface acoustic wave resonators or piezoelectric thin film resonators.

12. The acoustic wave filter according to claim 9, wherein the first resonator, the second resonator, and the fourth resonator are either surface acoustic wave resonators or piezoelectric thin film resonators.

* * * * *